US006818356B1

(12) United States Patent
Bates

(10) Patent No.: US 6,818,356 B1
(45) Date of Patent: Nov. 16, 2004

(54) THIN FILM BATTERY AND ELECTROLYTE THEREFOR

(75) Inventor: John B Bates, Oak Ridge, TN (US)

(73) Assignee: Oak Ridge Micro-Energy, Inc., Oak Ridge, TN (US)

( * ) Notice: Subject to any disclaimer, the term of this patent is extended or adjusted under 35 U.S.C. 154(b) by 216 days.

(21) Appl. No.: 10/191,859

(22) Filed: Jul. 9, 2002

(51) Int. Cl.[7] .......................... H01M 6/46; C23C 14/34; C01B 17/22; C01D 1/02

(52) U.S. Cl. ........................ 429/322; 429/127; 429/162; 429/231.95; 252/62.2; 204/192.15; 423/312; 423/594.15

(58) Field of Search ................................. 429/322, 127, 429/162, 231.95; 252/62.2; 423/312, 594.15; 204/192.15

(56) References Cited

U.S. PATENT DOCUMENTS

| 5,338,625 | A | | 8/1994 | Bates et al. | |
|---|---|---|---|---|---|
| 5,512,147 | A | | 4/1996 | Bates et al. | |
| 5,561,004 | A | * | 10/1996 | Bates et al. | .................. 429/162 |
| 5,569,520 | A | * | 10/1996 | Bates | .......................... 429/162 |
| 5,597,660 | A | | 1/1997 | Bates et al. | |
| 6,168,884 | B1 | * | 1/2001 | Neudecker et al. | ......... 429/162 |
| 6,242,132 | B1 | * | 6/2001 | Neudecker et al. | ...... 429/218.1 |
| 6,365,300 | B1 | * | 4/2002 | Ota et al. | .................... 429/304 |

FOREIGN PATENT DOCUMENTS

| EP | 1052718 A1 | * | 11/2000 | .......... H01M/10/36 |
|---|---|---|---|---|
| JP | 200340257 | | 12/2000 | |
| JP | 2001319520 | | 11/2001 | |

OTHER PUBLICATIONS

V.K. Deshpande, A. Pradel, and M. Ribes, "The Mixed Glass Former Effect in the Li2S:SiS2:GeS2 System", Mat. Res. Bull. vol. 23, No. 3, pp. 379–384 (1988). no month.

R. Creus, J. Sarradin, R. Astier, A. Pradel, and M. Ribes, "The Use of Ionic And Mixed Conductive Glasses in Microbatteries", Mater. Sci. and Eng. B3, pp. 109–112 (1989) no month.

J.B. Bates, N.J. Dudney, G.R. Gruzalski, R.A. Zuhr, A. Choudhry, C.F. Luck, "Electrical Properties of Amorphous Lithium Electrolyte Thin Films," Solid State Ionics 53–56, pp. 647–654 (1992). no month.

J.B. Bates, G.R. Gruzalski, N.J. Dudney, and C.F. Luck, "New Amorphous Thin–Film Lithium Electrolyte and Rechargeable Microbattery," p. 337 in Proceedings of 35th International Power Sources Symposium, Institute of Electrical and Electronics Engineers, Piscataway, New Jersey, 1993. no month.

(List continued on next page.)

Primary Examiner—Gregg Cantelmo
(74) Attorney, Agent, or Firm—Luedeka, Neely & Graham PC

(57) ABSTRACT

A solid amorphous electrolyte composition for a thin-film battery. The electrolyte composition includes a lithium phosphorus oxynitride material containing a sulfide ion dopant wherein the atomic ratio of sulfide ion to phosphorus ion (S/P) in the electrolyte ranges greater than 0 up to about 0.2. The composition is represented by the formula:

$$Li_wPO_xN_yS_z,$$

where $2x+3y+2z=5+w$, x ranges from about 3.2 to about 3.8, y ranges from about 0.13 to about 0.46, z ranges from greater than zero up to about 0.2, and w ranges from about 2.9 to about 3.3. Thin-film batteries containing the sulfide doped lithium oxynitride electrolyte are capable of delivering more power and energy than thin-film batteries containing electrolytes without sulfide doping.

22 Claims, 4 Drawing Sheets

OTHER PUBLICATIONS

K. Takada, N. Aotani, and S. Kondo "Electrochemical Behaviors of Li+ Ion Conductor, Li3P04–Li2S–SiS2", J. Power Sources 43–44, pp. 135–141 (1993) no month.

S.D. Jones and J.R. Akridge, "A Thin–Film Solid–State Microbattery", J. Power Sources 43–44, pp. 505–513 (1993). no month.

K. Iwamoto, N. Aotani, K. Takada, and S. Kondo, "Rechargeable Solid State Batter with Lithium conductive Glass, Li3P04–Li2S–SiS2", Solid State Ionics 70/71, pp. 658–661 (1994) no month.

J.B. Bates, G.R. Gruzalski, N.J. Dudney, C.F. Luck, and X. Yu, "Rechargeable Thin–Film Lithium Batteries," Solid State Ionics 70/71, pp. 619–628 (1994). no month.

X. Yu, J.B. Bates, G.E. Jellison, Jr., and F.X. Hart, "A Stable Thin–Film Lithium Electrolyte: Lithium Phosphorous Oxynitride," J. Electrochem, Soc. vol. 144, No. 2, pp. 524–532 (1997) no month.

J.B. Bates, N.J. Dudney, B.J. Neudecker, F.X. Hart, H.P. Jun, and S.A. Hackney, "Preferred Orientation of Polycrystalline LiCoO2 Films," J. Electrochem, Soc., 147 (1), pp. 59–70 (2000). no month.

J.B. Bates, N.J. Dudney, B. Neudecker, A. Ueda, and C.D. Evans, "Thin–Film Lithium and Lithium–Ion Batteries," Solid State Ionics 135, pp. 33–45 (2000). no month.

"Thin Film Battery Design", Oak Ridge National Laboratory, web page, copyright 2001. no month.

* cited by examiner

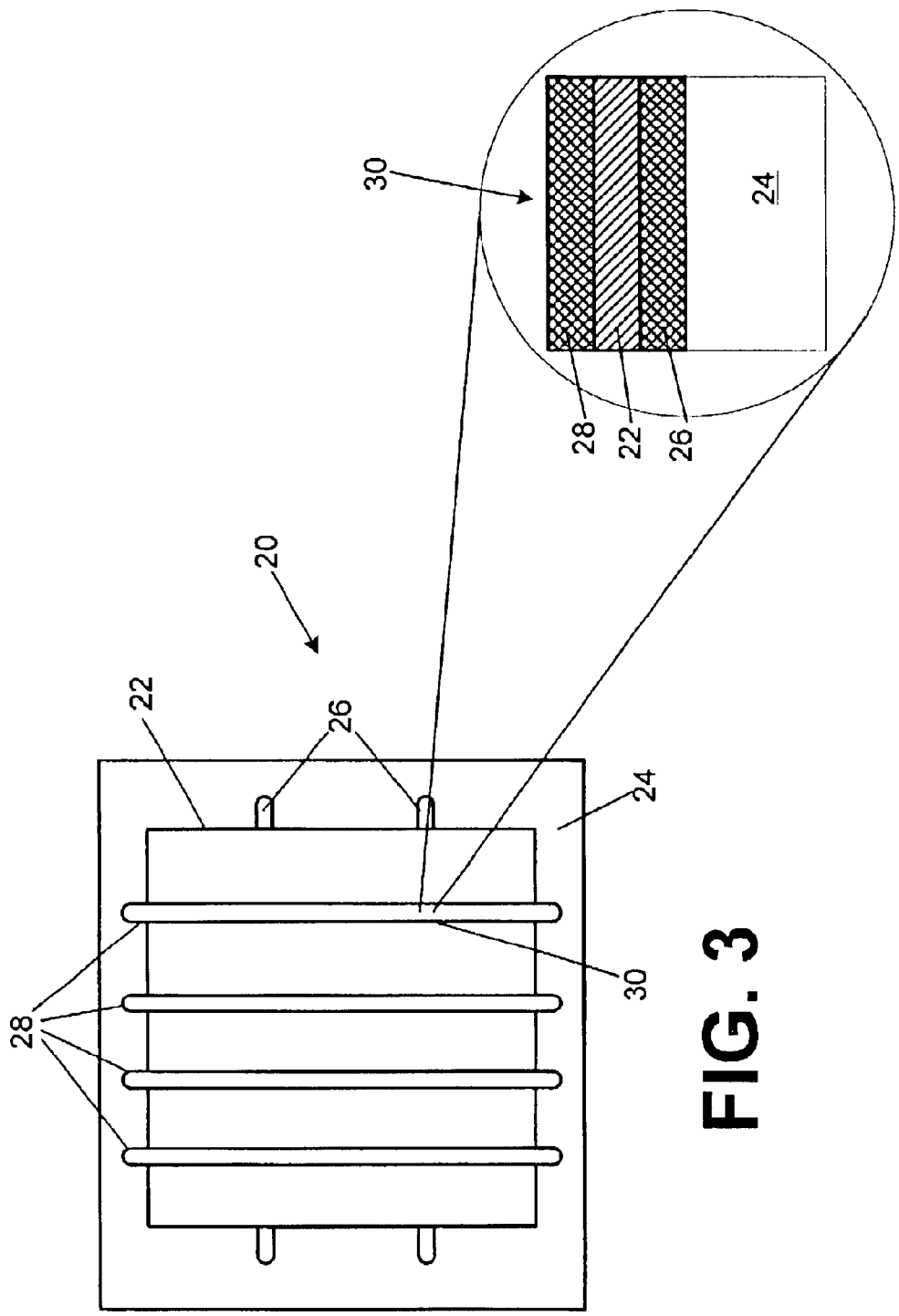

THIN FILM BATTERY AND ELECTROLYTE THEREFOR

FIELD OF THE INVENTION

The invention relates to thin film batteries and in particular to improved electrolytes for thin film batteries.

BACKGROUND OF THE INVENTION

Thin-film rechargeable batteries have numerous applications in the field of microelectronics. For example, thin-film batteries provide active or standby power for microelectronic devices and circuits. Active power sources of the thin-film battery type are used, for example, in implantable medical devices, remote sensors, miniature transmitters, smart cards, and MEMS devices. Standby power sources of the thin-film battery type are used, for example, in PCMCIA cards and other types of CMOS-SRAM memory devices.

In a thin-film battery, a chemical reaction takes place between an anode and cathode by interaction of the anode and cathode through an electrolyte. The attractiveness of thin-film batteries over conventional batteries is that the electrolyte is a substantially solid or non-flowable material rather than a liquid. Liquid electrolytes pose leakage problems and are often highly corrosive. Of the solid electrolytes, thin-film batteries typically employ organic and ceramic electrolytes. Solid electrolytes are desirable in cells or batteries where liquid electrolytes may be undesirable, such as in implantable medical devices. Preferred solid electrolytes include materials that are solid at room temperature, electrically insulative and ionically conductive.

Examples of solid electrolytes include metallic salts and vitreous solid compositions. Metallic salt solid electrolytes include, for example, compounds that conform to the formula: AgI—MCN—AgCN, wherein M is potassium, rubidium, cesium or mixtures thereof. Vitreous solid compositions, or glasses, are generally comprised of a network former, a network modifier and a network dopant. A network former provides a macromolecular network of irregular structure. A network modifier is an ionic compound that becomes incorporated into the macromolecular network of the network former. A network dopant provides mobile cations to the network. While solid electrolytes are preferred for various applications, such solid electrolytes tend to exhibit lower specific conductivities than liquid electrolytes. Hence batteries employing solid electrolytes tend to operate at lower currents than batteries using liquid electrolytes.

As advances are made in microelectronic devices, new uses for thin-film batteries continue to emerge. Along with the new uses, there is a need for high performance thin-film batteries having improved properties such as higher electrolyte conductivities, more stable electrolytes, and the like. In particular, there is a need for thin film batteries that use solid electrolytes and that operate at higher currents as compared to current solid electrolyte batteries.

SUMMARY OF THE INVENTION

In one embodiment, with regard to the foregoing and other needs, the invention provides a solid amorphous electrolyte composition for a thin-film battery. The electrolyte composition includes a lithium phosphorus oxynitride material containing a sulfide ion dopant wherein the atomic ratio of sulfide ion to phosphorus ion (S/P) in the electrolyte ranges from greater than 0 up to about 0.2. The composition is represented by the formula:

where $2x+3y+2z=5+w$, x ranges from about 3.2 to about 3.8, y ranges from about 0.13 to about 0.46, z ranges from greater than zero up to about 0.2, and w ranges from about 2.9 to about 3.3.

In another embodiment the invention provides a method for making a solid electrolyte for a thin-film battery. The method includes the steps of:

providing a lithium orthophosphate ($Li_3PO_4$) composition;

providing a lithium ion and sulfide ion containing component selected from the group consisting of $Li_2SO_4$ and $Li_2S$;

combining the lithium orthophosphate composition and the lithium ion and sulfide ion containing component to yield a sputtering target;

sputtering the target in a gas atmosphere selected from nitrogen gas, argon gas, and mixtures of nitrogen and argon gases to provide an electrolyte film having a composition represented by the formula:

where $2x+3y+2z=5+w$, x ranges from about 3.2 to about 3.8, y ranges from about 0.13 to about 0.46, z ranges from greater than zero up to about 0.2, and w ranges from about 2.9 to about 3.3, and wherein the ratio of sulfide ion to phosphorus ion (S/P) ranges from greater than 0 up to about 0.2.

In yet another embodiment, the invention provides a method for making a sulfide-doped lithium phosphorus oxynitride solid electrolyte for a thin-film battery. The method includes the steps of:

providing a lithium orthophosphate ($Li_3PO_4$) composition as a sputtering target;

sputtering the target in an atmosphere containing nitrogen gas and hydrogen sulfide gas wherein the mixture of nitrogen gas and hydrogen sulfide gas in the atmosphere is represented by the following:

$$(1-t)N_2 + tH_2S,$$

where t is greater than 0 and less than 1 to provide an electrolyte film having a composition represented by the formula:

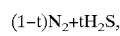

where $2x+3y+2z=5+w$, x ranges from about 3.2 to about 3.8, y ranges from about 0.13 to about 0.46, z ranges from greater than zero up to about 0.2, and w ranges from about 2.9 to about 3.3, and wherein the ratio of sulfide ion to phosphorus ion (S/P) ranges from greater than 0 up to about 0.2.

An important advantage of the invention is that thin-film batteries containing the electrolyte of the invention are capable of delivering more power and energy than thin-film batteries containing conventional undoped lithium phosphorus oxynitride (LIPON) electrolytes. By selecting a desired amount of sulfide doping, the lithium ion conductivity of the electrolyte of the invention can be significantly increased over the lithium ion conductivity of conventional LIPON electrolytes. At room temperature, a LIPON electrolyte has a lithium ion conductivity of about 2 $\mu$S/cm and a transport number of unity. Because its conductivity is relatively low, the LIPON electrolyte is a dominant contributor to cell resistance. For example, in thin-film batteries containing a lithium cobalt oxide ($LiCoO_2$) cathode, the LIPON electrolyte dominates the cell resistance until the thickness of the cathode reaches about 3.5 μm. The invention enables an increase of the ionic conductivity of the electrolyte, resulting in an increase of the energy availability at higher discharge rates (higher powers) as compared to conventional LIPON electrolytes.

BRIEF DESCRIPTION OF THE DRAWINGS

Further advantages of the invention will become apparent by reference to the detailed description when considered in conjunction with the figures, wherein like reference numbers indicate like elements throughout, and wherein:

FIG. 3 is a plan view, not to scale, of a conductivity cell containing an electrolyte according to the invention;

FIG. 4 is a cross-sectional view, not to scale, of a portion of the conductivity cell of FIG. 3;

DETAILED DESCRIPTION OF THE INVENTION

As set forth above, the invention provides an improved thin-film battery electrolyte and method for making the electrolyte. The electrolyte of the invention includes a solid lithium phosphorus oxynitride (LIPON) electrolyte. According to the invention, the LIPON-based electrolyte is improved by incorporating therein a sulfide ion. The amount of sulfide ion in the electrolyte composition is preferably expressed in terms of a sulfide ion to phosphorus ion ratio (S/P). The S/P ratio preferably ranges from greater than zero up to about 0.2, more preferably from about 0.10 to about 0.15, and most preferably abut 0.15.

Electrolytes of the invention incorporating a sulfide ion are preferably solid amorphous compositions represented by the following formula:

where $2x+3y+2z=5+w$, x ranges from about 3.2 to about 3.8, y ranges from about 0.13 to about 0.46, z ranges from greater than zero up to about 0.2, and w ranges from about 2.9 to about 3.3. Compositions of the foregoing formula, preferably contain from about 37.4 to about 39.7 atomic percent lithium ion, from about 11.8 to about 13.1 atomic percent phosphorus ion and from about 41.7 to about 45.4 atomic percent oxygen ion in addition to the sulfide ion and nitrogen ion. Examples of electrolyte compositions of the invention having the preferred S/P ratios are given in the following table:

| Li ion (atomic %) | P ion (atomic %) | Oxygen ion (atomic %) | Nitrogen ion (atomic %) | Sulfide ion (atomic %) |
|---|---|---|---|---|
| 39.43 | 11.95 | 45.40 | 2.03 | 1.19 |
| 39.66 | 12.02 | 44.47 | 2.64 | 1.20 |
| 37.81 | 13.04 | 43.02 | 4.82 | 1.30 |
| 37.86 | 13.05 | 41.78 | 6.01 | 1.31 |
| 39.36 | 11.93 | 45.33 | 1.59 | 1.79 |
| 37.74 | 13.02 | 42.95 | 4.34 | 1.95 |
| 38.94 | 11.80 | 44.90 | 2.60 | 1.77 |
| 37.40 | 12.89 | 41.84 | 5.93 | 1.93 |

Electrolytes of the foregoing composition may be used in thin-film batteries having oxide-based cathodes, such as $LiCoO_2$ and $LiMn_2O_4$, that operate at potentials above 3.8 volts.

Figure 2:
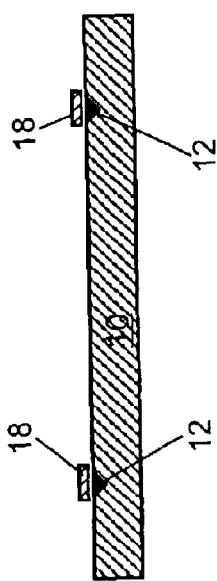
FIG. 2 is a cross sectional view, not to scale, of the target of FIG. 1, taken along line 2—2 of FIG. 1.
Figure 1:
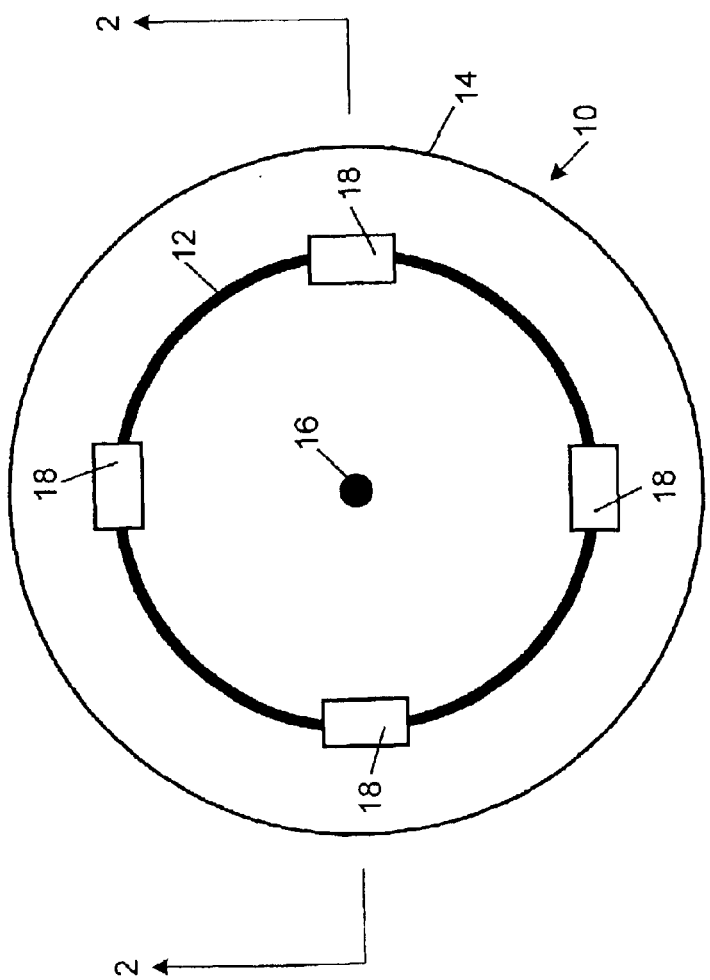
FIG. 1 a plan view, not to scale, of a lithium orthophosphate target having an erosion groove and sulfide containing material distributed thereon.

The conductivity of electrolytes containing a range of SIP ratios was determined by depositing electrolyte films onto a substrate by radio frequency magnetron sputtering of targets 10 (FIG. 1) in pure nitrogen gas. The target 10 was a disk of lithium orthophosphate ($Li_3PO_4$) formed by hot pressing $Li_3PO_4$ powder. The magnetic field generated during radio frequency (rf) magnetron sputtering of the target 10 in a nitrogen gas atmosphere, concentrated working gas ions, i.e., nitrogen ions, in an annular region located between an edge 14 of the target 10 and a center 16 of the target 10. Hence, an erosion groove 12 ("race track"), as shown in FIGS. 1 and 2, was formed in the target 10. Most of the material sputtered from the target 10 onto the substrate is known to come from this erosion groove 12.

A conductivity cell 20 containing an electrolyte film of the invention, as shown in FIG. 3, was made using a lithium orthophosphate target 10 as described above. A lithium ion and sulfide ion containing powder 18 selected from the group consisting of $Li_2SO_4$ and $Li_2S$ was distributed in the erosion groove 12 area of the target 10. By changing the fraction or amount of powder 18 in the erosion groove 12, lithium phosphorus oxynitridesulfide films 22 having a wide range of sulfur concentrations were made. The films 22 were deposited on a substrate of borosilicate glass 24 between gold electrodes 26 and 28 as shown in FIGS. 3 and 4 to provide a conductivity cell 20.

The conductivity cell 20 was made by first depositing two gold electrodes 26 onto the substrate 24 using conventional metal deposition techniques. Next, the electrolyte film 22 was deposited, as described above, onto the electrodes 26. The thickness of the film 22 determined from surface profile measurements ranged from 0.8 to 1.2 microns. Finally, four gold electrodes 28 were deposited over the electrolyte film 22. The effective cross-sectional area of each square region 30 of the film 22 where the top and bottom electrodes crossed was about 0.04 cm². By making electrical contact with one of the two bottom electrodes 26 and one of the four top electrodes 28, the conductivity of different regions of the film 22 was measured.

Figure 5:
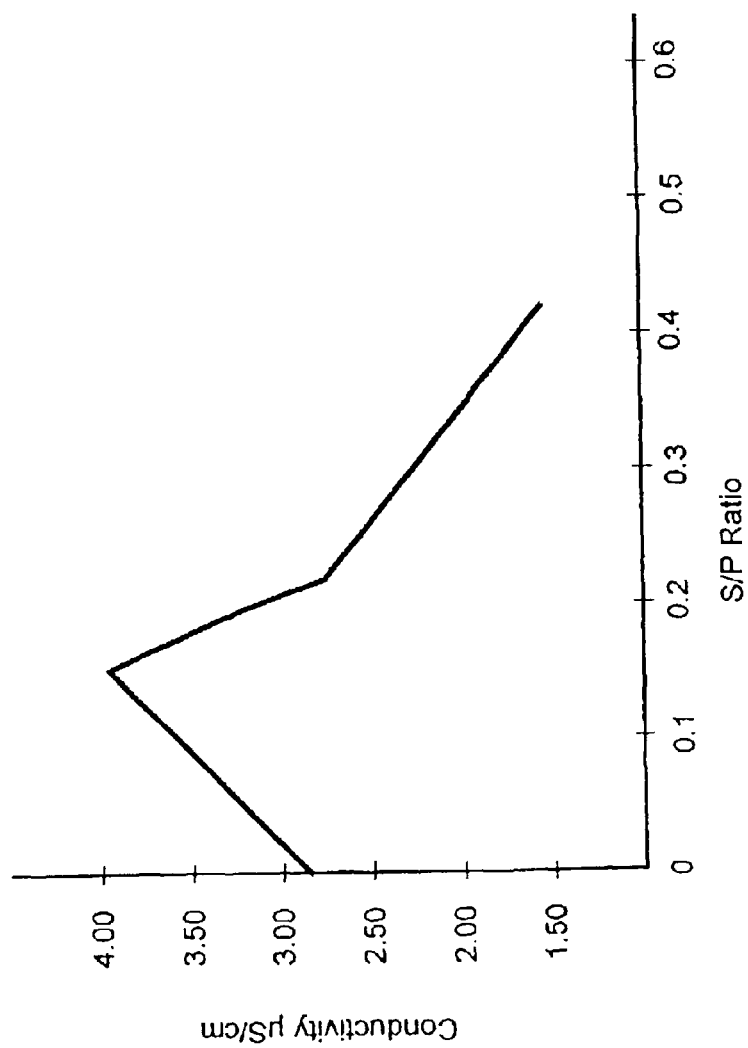
FIG. 5 is a graphical representation of an effect of sulfide ion to phosphorus ion ratio on a conductivity of a solid lithium phosphorus oxynitride electrolyte.

A graphical representation of the observed variation in conductivity of electrolyte films of the invention having various sulfide ion concentrations is provided in FIG. 5. Qualitative values of the atomic ratios of phosphorus (P), oxygen (O) and sulfur (S) in the electrolyte films 22 were determined from the relative intensities of the Kα and Lβ x-ray fluorescence lines of these elements measured with an energy dispersive x-ray (EDX) analyzer attached to a scanning electron microscope. The atomic ratio measurements were made on electrolyte films 22 deposited onto copper foils during the same run the conductivity cell 20 samples were made.

As seen in FIG. 5, as the concentration ratio of sulfide ion to phosphorus ion in the electrolyte increases from 0 up to about 0.15, there is about a 40% increase in the conductivity of the electrolyte film. Above an S/P ratio of about 0.15, the conductivity decreases, and dramatically drops off between S/P of about 0.3 to about 0.5. The S/P ratios were calculated from the relative intensities of the sulfur and phosphorus x-ray peaks in the EDX spectra of the film using the ratios of the oxygen and sulfur peak intensities and the ratios of the oxygen and phosphorus peak intensities obtained from the EDX measurements on $Li_2SO_4$ and $Li_3PO_4$ powders respectively. The calculations were made using the assumption that the electrolyte films were represented by the following formula:

$$Li_3PO_{4-x}S_x,$$

where x is the number of sulfide atoms in the electrolyte composition. Although the nitrogen content was unknown, it was assumed to be in the range of from about 2 to about 4 atomic percent as in the case of LIPON.

A method for making a thin-film battery 40 containing the electrolyte film 42 of the invention will now be described with respect to FIGS. 6–10. The battery 40 preferably includes an insulating support or substrate 44, thin film current collectors 46 and 48, a thin film cathode 50, and a thin film anode 52. Methods for making thin-film batteries are generally well known. Preferred methods are described, for example, in U.S. Pat. No. 5,338,625 to Bates et al., U.S. Pat. No. 5,512,147 to Bates et al., and U.S. Pat. No. 5,597,660 to Bates et al., the disclosures of which are incorporated by reference thereto as if fully set forth herein.

Figure 7:
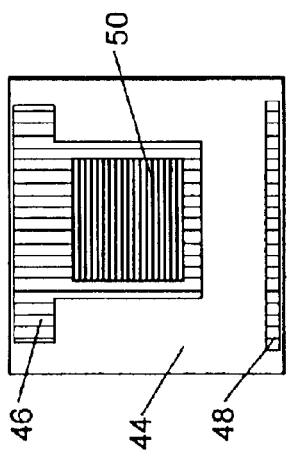
FIGS. 7–10 are plan views, not to scale, of portions of a thin-film battery to illustrate steps during manufacture of thin-film batteries containing electrolytes according to the invention.

In a preferred first step of the thin-film battery manufacturing process, two current collectors 46 and 48 are deposited on a substrate 44 (FIG. 7). The substrates are preferably selected from ceramic, semiconductor, and polymeric materials such as glass, alumina, sapphire, silicon, plastic and the like. The current collectors 46 and 48 are preferably thin metal films or thin films of electrically conductive oxides. The metals for the metal films are selected from noble and transition metals such as gold, platinum, vanadium, cobalt, nickel, manganese, niobium, tantalum, chromium, molybdenum, titanium, zirconium, tungsten and the like.

The preferred metallic cathode current collector 46 is a 300 angstrom thick transition metal, preferably cobalt (Co) for a $LiCoO_2$ cathode or manganese (Mn) for a $LiMn_2O_4$ cathode covered with a 1000 to 1200 angstrom thick gold film. Alternatively, the cathode current collector 46 may be selected from a single film of titanium (Ti), tantalum (Ta), or tungsten (W) having a thickness ranging from about 1000 to about 1200 angstroms. A preferred electrically conductive oxide thin film is indium tin oxide (ITO) having a thickness ranging from about 1000 to about 1200 angstroms.

The preferred anode current collector 48 may be selected from copper, tantalum, and vanadium. For lithium-ion thin film batteries with inorganic anodes such as tin oxide ($SnO_2$), tin nitride ($Sn_3N_4$), and zinc nitride ($Zn_3N_2$), the most preferred current collector 48 is copper. The current collectors 46 and 48 may be deposited by rf or direct current (dc) magnetron sputtering, diode sputtering in argon, vacuum evaporation, or other deposition techniques such as used by the semiconductor electronics industry. The currents collectors 46 and 48 typically have a thickness ranging from about 0.1 to about 0.3 microns.

Figure 8:
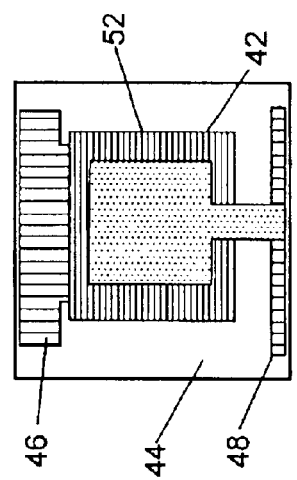

A conductive cathode thin film providing cathode 50 is then deposited over a portion of the current collector 46 (FIG. 8). The cathode thin film is preferably a metal oxide, more preferably a transition metal oxide, and most preferably a metal oxide containing the metal of the current collector 46. Preferred cathodes 50 include, but are not limited to, lithium transition metal oxides such as $LiCoO_2$, $LiNiO_2$, $LiMn_2O_4$, $LiCo_{(1-v)}Ni_vO_2$, and the like, where v ranges from about 0.5 to about 1.0, and transition metal oxides such as crystalline or amorphous vanadium pentoxide ($V_2O_5$). The cathode 50 is preferably a 1 to 3 micron thick film that is deposited on the current collector 46 by sputtering alkali metal-transition metal oxide targets in an essentially pure argon atmosphere or in an argon atmosphere containing from about 1 to about 20 volume percent oxygen.

Figure 9:
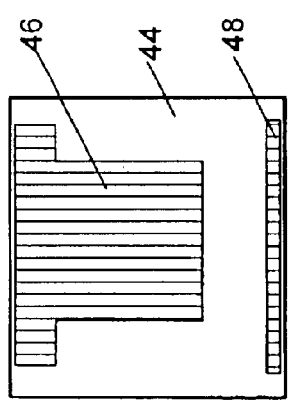

An amorphous lithium phosphorus oxynitride sulfide thin-film electrolyte 42 is then deposited over the cathode 50 and current collector 46 (FIG. 9). The electrolyte 42, according to the invention, is provided as described above by sputtering a lithium orthophosphate target 10 having distributed thereon a lithium ion and sulfide ion containing powder selected from the group consisting of $Li_2SO_4$ and $Li_2S$. In the alternative, the target 10 may be a hot pressed or cold pressed and sintered disk made from a mixture of $Li_3PO_4$ powder and a powder selected from sulfur, $Li_2SO_4$, and $Li_2S$. The electrolyte 42 may also be made by sputtering a lithium orthophosphate target 10 in an atmosphere containing nitrogen gas and hydrogen sulfide gas.

The target 10 is preferably rf magnetron sputtered in a nitrogen gas, argon gas, or mixture of nitrogen gas and argon gas atmosphere at a pressure ranging from about 5 to about 20 milliTorr and a total gas flow ranging from about 20 to about 100 standard cubic centimeters per minute (sccm) for a typical small research vacuum chamber. The electrolyte 42 provided by the sputtering target 10, preferably has a thickness ranging from about 0.5 to about 1.5 microns. The target 10 is sputtered for a period of time ranging from about 0.5 to about 2.5 hours at a sputtering power ranging from about 5 to about 7.5 watts per square centimeter averaged over the total area of the target to provide a film deposition rate averaging from about 100 to about 150 angstroms per minute. The electrolyte made according to the foregoing procedure is a composition of the formula:

$$Li_wPO_xN_yS_z$$

where $2x+3y+2z=5+w$, x ranges from about 3.2 to about 3.8, y ranges from about 0.13 to about 0.46, z ranges from greater than zero up to about 0.2, and w ranges from about 2.9 to about 3.3.

Figure 6:
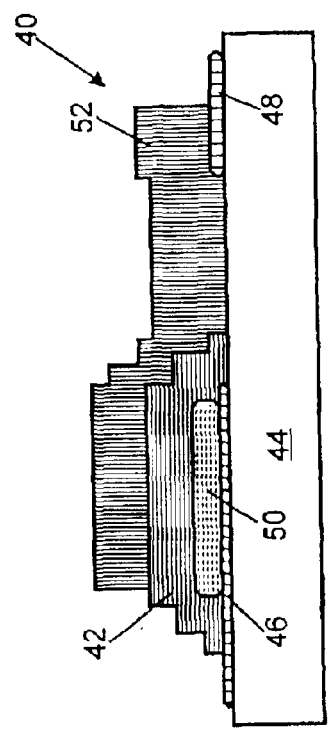
FIG. 6 is a cross-sectional view, not to scale, of a thin-film battery containing an electrolyte according to the invention.
Figure 10:
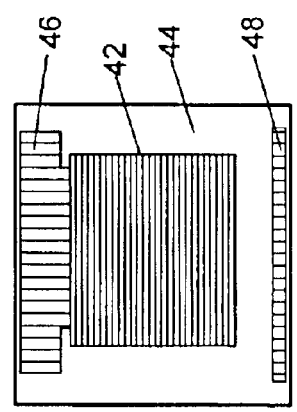

The thin-film battery 40 is completed by depositing a metallic anode 52 over a portion of the electrolyte 42, substrate 44 and current collector 48 as shown in FIGS. 6 and 10. The anode 52 is preferably provided by an alkali metal such as sodium, lithium, potassium, rubidium, cesium and the like. For a lithium containing electrolyte, the preferred alkali metal for the anode is lithium or a lithium containing alloy. The metallic anode may be deposited by evaporation or sputtering techniques and typically has a thickness ranging from about 3 to about 5 microns. For lithium-ion thin film batteries, the anode 52 is preferably provided by metal nitrides or metal oxides. Metal nitrides such as $Sn_3N_4$ and $Zn_3N_2$ may be formed by sputtering tin or zinc in a pure nitrogen gas atmosphere. Inorganic anodes of metal oxides such as $SnO_2$ may be deposited by reactive sputtering of the base metals in an atmosphere of argon and oxygen.

Having described various aspects and embodiments of the invention and several advantages thereof, it will be recognized by those of ordinary skills that the invention is susceptible to various modifications, substitutions and revisions within the spirit and scope of the appended claims.

What is claimed is:

1. A solid amorphous electrolyte composition for a thin-film battery comprising a lithium phosphorus oxynitride material containing a sulfide ion dopant wherein the atomic ratio of sulfide ion to phosphorus ion (S/P) in the electrolyte ranges from greater than 0 up to about 0.2 and wherein the composition is represented by the formula:

$$Li_wPO_xN_yS_z,$$

where $2x+3y+2z=5+w$, x ranges from about 3.2 to about 3.8, y ranges from about 0.13 to about 0.46, z ranges from greater than zero up to about 0.2, and w ranges from about 2.9 to about 3.3.

2. The composition of claim 1 wherein the S/P ratio ranges from about 0.10 to about 0.15.

3. The composition of claim 1 comprising from about 37.4 to about 39.7 atomic percent lithium ion.

4. The composition of claim 1 comprising from about 11.8 to about 13.1 atomic percent phosphorus ion.

5. The composition of claim 1 comprising from about 41.7 to about 45.4 atomic percent oxygen ion.

6. A thin-film battery comprising the solid electrolyte of claim 1.

7. The thin-film battery of claim 6 comprising a cathode selected from the group consisting of $LiCoO_2$, $LiNiO_2$, $LiMn_2O_4$, and $V_2O_5$.

8. The thin-film battery of claim 7 including a cathode current collector comprising indium tin oxide.

9. A method for making a solid electrolyte for a thin-film battery comprising the steps of:

providing a lithium orthophosphate ($Li_3PO_4$) composition;

providing a lithium ion and sulfide ion containing component selected from the group consisting of $Li_2SO_4$ and $Li_2S$;

combining the lithium orthophosphate powder and the lithium ion and sulfide ion containing powder to provide a sputtering target;

sputtering the target in a gas atmosphere selected from nitrogen gas, argon gas, and mixtures of nitrogen and argon gases to provide an electrolyte film having a composition represented by the formula:

$$Li_wPO_xN_yS_z,$$

where $2x+3y+2z=5+w$, x ranges from about 3.2 to about 3.8, y ranges from about 0.13 to about 0.46, z ranges from greater than zero up to about 0.2, and w ranges from about 2.9 to about 3.3, and wherein the ratio of sulfide ion to phosphorus ion (S/P) ranges from greater than 0 up to about 0.2.

10. The method of claim 9 wherein the S/P ratio ranges from about 0.10 to about 0.15.

11. The method of claim 9 wherein the sputtering is conducted in pure nitrogen gas.

12. The method of claim 9 wherein the sputtering is conducted in pure argon gas.

13. The method of claim 9 wherein the sputtering is conducted in a mixture of nitrogen gas and argon gas.

14. The method of claim 9 wherein the sputtering is conducted over a thin-film battery cathode material selected from the group consisting of $LiCoO_2$, $LiNiO_2$, $LiMn_2O_4$, and $V_2O_5$.

15. A thin-film battery containing a solid electrolyte made by the method of claim 9.

16. The thin-film battery of claim 15 including a cathode current collector comprising indium tin oxide.

17. A method for making a sulfide-doped solid lithium phosphorus oxynitride electrolyte for a thin-film battery comprising the steps of:

providing a lithium orthophosphate ($Li_3PO_4$) composition as a sputtering target;

sputtering the target in an atmosphere containing nitrogen gas and hydrogen sulfide gas wherein the mixture of nitrogen gas and hydrogen sulfide gas in the atmosphere is represented by the following:

$$(1-t)N_2+tH_2S,$$

where t is greater than 0 and less than 1 to provide an electrolyte film having a composition represented by the formula:

$$Li_wPO_xN_yS_z,$$

where $2x+3y+2z=5+w$, x ranges from about 3.2 to about 3.8, y ranges from about 0.13 to about 0.46, z ranges from greater than zero up to about 0.2, and w ranges from about 2.9 to about 3.3, and wherein the ratio of sulfide ion to phosphorus ion (S/P) ranges from greater than 0 up to about 0.2.

18. The method of claim 17 wherein the S/P ratio ranges from about 0.10 to about 0.15.

19. The method of claim 17 wherein the sputtering is conducted in a mixture of nitrogen gas and argon gas.

20. The method of claim 17 wherein the sputtering is conducted over a thin-film battery cathode material selected from the group consisting of $LiCoO_2$, $LiNiO_2$, $LiMn_2O_4$, and $V_2O_5$.

21. A thin-film battery containing a solid electrolyte made by the method of claim 17.

22. The thin-film battery of claim 21 including a cathode current collector comprising indium tin oxide.

* * * * *